United States Patent [19]

Kobayashi et al.

[11] 4,293,986
[45] Oct. 13, 1981

[54] METHOD OF MAKING A QUARTZ CRYSTAL OSCILLATOR

[75] Inventors: Masatoshi Kobayashi; George Shimakawa; Yukio Hara, all of Nagano; Hiroyuki Fujii, Suwa, all of Japan; Kabushiki Kaisha Seikosha, 03, Suwa, both of Japan

[73] Assignee: Matsushima Kogo Kabushiki Kaisha, Toyko

[21] Appl. No.: 966,688

[22] Filed: Dec. 5, 1978

[30] Foreign Application Priority Data

Dec. 5, 1977 [JP] Japan ............................. 52-145863
Dec. 5, 1977 [JP] Japan ............................. 52-145864

[51] Int. Cl.³ ........................................... H01L 41/22
[52] U.S. Cl. ................................. 29/25.35; 228/121; 228/198; 310/344; 310/370
[58] Field of Search ............... 29/25.35; 310/344, 370; 228/121, 198

[56] References Cited

U.S. PATENT DOCUMENTS 3,857,161 12/1974 Hutchin .............................. 228/121
4,077,558 3/1978 Carlson et al. .................... 228/121
4,135,108 1/1979 Besson .............................. 310/344

*Primary Examiner*—Carl E. Hall
*Attorney, Agent, or Firm*—Blum, Kaplan, Friedman, Silberman & Beran

[57] ABSTRACT

A quartz crystal oscillator package comprising a quartz crystal vibrator leaf enclosed in an evacuated housing. The vibrator leaf frame is sandwiched and sealed between a pair of housing elements formed by etching at one time the periphery of each housing element and at another time etching a concave portion in each housing element. Opposed concave portions provide the internal volume wherein the vibrator leaf is sealed under vacuum. Using heat and vacuum, a metal film deposited on the sealing surfaces of the housing elements fuses with a binder material to form a eutectic alloy seal. A flat package having small size, high structural strength, an excellent hermetic seal, and high internal vacuum is produced by this method.

3 Claims, 14 Drawing Figures

FIG. 4
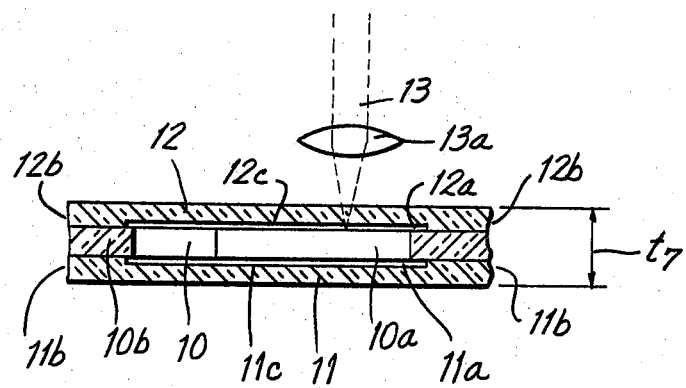
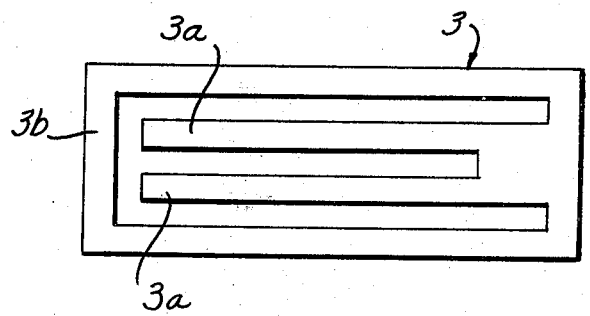
FIG. 5

METHOD OF MAKING A QUARTZ CRYSTAL OSCILLATOR

BACKGROUND OF THE INVENTION

This invention relates generally to a quartz crystal oscillator of the type used in electronic wristwatches and more particularly to a quartz crystal oscillator package which has high strength, high internal vacuum, a good hermetic seal, and a low, flat profile. In conventional oscillator packages at least one flat face of the package is transparent to permit passage of a laser beam used in adjusting the frequency of the enclosed vibrator. The housing elements used to form the package are fabricated by etching a sheet of planar material such as quartz or glass. In the prior art the material was etched from both sides simultaneously to produce completed housing elements. This simultaneous etching method presents a problem in that the peripheral edges are a weak point leading to breakage of the package. Also in the prior art, the concave portion in which the crystal vibrator is enclosed in the completed package, is also etched while the peripheral edges are being formed by etching. As a result, the wall thickness of the package is reduced to approximately half the thickness of the original material leaving a wall which is structurally weak and subject to breakage.

An additional problem with the oscillator packages of the prior art is caused by the method of sealing the housing elements to the quartz crystal vibrator leaf. In the prior art, a low melting point solder has been used at the peripheral edges to provide the seal. However, outgassing from the solder at the time of sealing causes gas to enter the cavity wherein the vibrator leaf is enclosed. Thus, although the process is carried out under vacuum, the resulting product has a poor internal vacuum and produces an oscillator lacking in high Q performance. Because of the ultraminiature size of the completed oscillator package, even a small amount of inleakage of gas from the sealing material destroys the vacuum within the package.

What is needed is a quartz crystal oscillator package which has sufficient wall thickness to provide high strength and yet has a low profile. The peripheral edges of the package should not be a source of weakness and the sealing process should produce a high quality hermetic seal which does not permit gases to enter the enclosed volume of the package during the process of sealing.

SUMMARY OF THE INVENTION

Generally speaking, in accordance with the invention, a quartz crystal oscillator package especially suited for electronic wristwatches is provided. The oscillator package comprises a quartz crystal vibrator leaf enclosed in an evacuated housing. The vibrator leaf frame is sandwiched and sealed between a pair of housing elements formed by etching, at one time, the periphery of each housing element and, at another time, etching a concave portion in each housing element. At the peripheral edges, etching is carried out until more than half the thickness of the material is removed. Etching of the peripheral edges is completed from both sides thereby producing a peripheral edge which is generally square, without extended protrusion, and having high strength. A very shallow concave portion is then etched into the base material thereby leaving a thick wall having high strength. A transparent material such as quartz or glass is used to form at least one housing element of a package comprising two housing elements. Opposed concave portions provide the internal volume wherein the vibrator leaf is sealed under vacuum. Using heat and vacuum at the time of sealing, a metal film which has been deposited on the sealing surfaces of the housing elements fuses with a binder material to form a eutectic alloy seal. Silver or gold provide suitable metal films and components such as tin, indium, or polycrystalline silicon, act as a binding material. The fusion process produces minimal gas which could flow into the evacuated chamber of the package.

One side of the oscillator package is made of a transparent material such as quartz, glass, silicon, so that a laser beam may be passed through the wall to act upon the crystal vibrator in order to provide fine adjustment in oscillation frequency.

Accordingly it is an object of this invention to provide an improved quartz crystal oscillator package and a method for production thereof.

Another object of this invention is to provide an improved quartz crystal oscillator package wherein the walls are thick and strong, the profile is flat, and the peripheral edges are not subject to breakage.

A further object of this invention is to provide an improved quartz crystal oscillator package wherein the housing element contours are etched in separate etching processes in order to provide optimum dimensional characteristics at all locations in the package.

Still another object of this invention is to provide a quartz crystal oscillator package having a high level of internal vacuum and a good hermetic seal at the peripheral edges.

Yet another object of this invention is to provide a quartz crystal oscillator package having a seal which does not substantially outgas during the process of joining.

Still other objects and advantages of the invention will in part be obvious and will in part be apparent from the specification.

The invention accordingly comprises the several steps and the relation of one or more of such steps with respect to each of the others, and the article possessing the features, properties, and the relation of elements, which are exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 4 is a side sectional view of a quartz crystal oscillator package of this invention using the housing elements of FIGS. 3A through 3D;

FIG. 5 is a conventional quartz crystal vibrator leaf with surrounding frame;

DESCRIPTION OF THE PREFERRED EMBODIMENTS

This invention relates to an ultra-thin quartz crystal oscillator package constructed in such a way that a quartz crystal vibrator leaf is sandwiched between two housing elements, each element having a concave portion formed therein by chemical etching. In an exemplary embodiment, at least one housing element of the package is made of a transparent material.

Figure 1A:
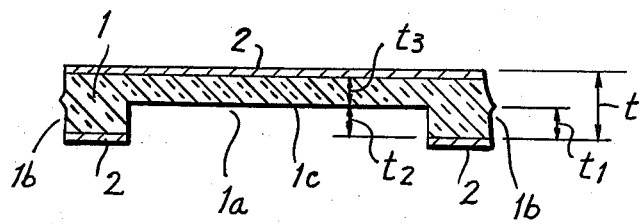
FIG. 1A is a side sectional view of a housing element employed in a conventional quartz crystal oscillator package of the prior art.
Figure 1B:
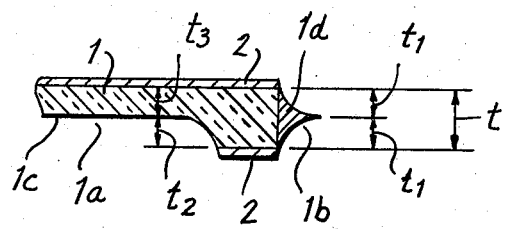
FIG. 1B is a view similar to FIG. 1A where the chemical etching process for production of the housing element was completed in a short time.
Figure 1C:
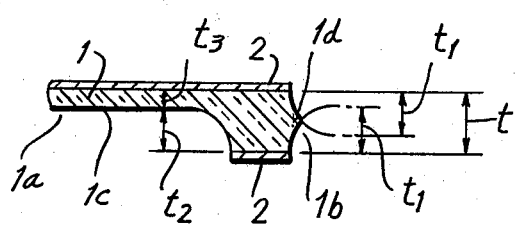
FIG. 1C is a view similar to FIG. 1A wherein the chemical etching process was completed in a long period of time.
Figure 2:
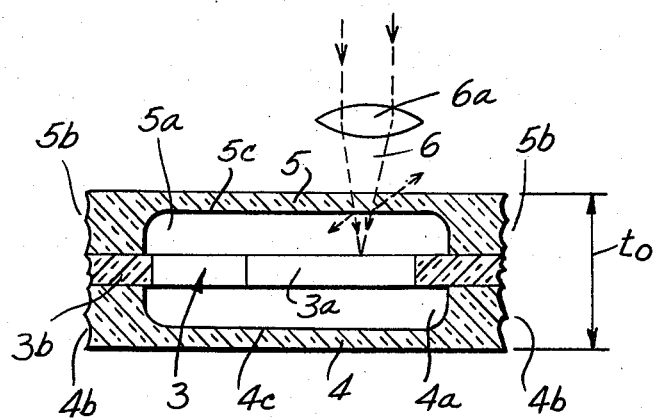
FIG. 2 is a side sectional view of a quartz crystal oscillator of the prior art employing housing elements as shown in FIG. 1.

FIGS. 1A through 1C show conventional examples of prior art housing elements having a concave portion formed therein by chemical etching. The housing element is made of a transparent material. FIG. 2 illustrates a conventional example of the prior art of ultra-thin quartz crystal oscillator packages using the housing elements of FIGS. 1A through 1C.

A housing element 1, provided by chemically etching the concave portion 1a and the peripheral portions 1b simultaneously is shown in FIGS. 1A, 1B and 1C. FIG. 1A is a side sectional view of a housing element 1 and FIGS. 1B and 1C are side sectional views showing the difference in cross-sectional shape due to the period of time used in chemical etching. The housing element 1 is formed by chemically etching a transparent material such as quartz crystal, glass, silicon and the like. The concave portion 1a is formed by chemically etching an area on only one side of the blank used in preparing the housing element 1. The peripheral edge portion 1b is cut out of the blank by chemical etching from both sides to form the outline of a housing element 1. A metal mask 2 is provided on the surface of the housing element 1 in order to limit the boundaries of chemical etching. Gold, chromium, or the like are materials used as metal masks 2. A generally planar surface 1c is produced at the base of the concave portion by removal of material by chemical etching.

FIGS. 1B and 1C show the relationship in the cross-sectional shape between the thickness t of a housing element, the chemical etching depth $t_1$ at the peripheral edge portion 1b, the chemical etching depth $t_2$ at the concave portion 1a, and the remaining thickness $t_3$ of the original blank material at the location of the concave portion 1a.

FIG. 1B shows the result produced after etching a blank having an original thickness t. The blank is etched simultaneously from both sides for an amount of time such that the material removed has a depth equal to $t_1$. In this case, t equals $2t_1$ since the material is removed equally from both sides of the blank. However, a large projection 1d is formed in the lateral direction at the peripheral edge portions 1b. It can also be seen that the material remaining in opposition to the concave portion 1a has a thickness $t_3$. After etching for an equal time simultaneously from both sides of the blank, it can be seen that $t_1 = t_2 = t_3$.

FIG. 1C shows the result in an example where the chemical etching is continued for a period greater than that used in etching the examples of FIG. 1B. It can be seen that the amount of material $t_1$ which will be etched away from each side exceeds one-half of the thickness t of the blank material, that is, t is $<2t_1$. As a result of this extended time etching, the housing element which is produced has a very small projection 1d at the peripheral edge portion as compared to the edge portion 1d shown in FIG. 1B. The concave portion 1a is etched during the extended time period and reaches a depth shown in FIG. 1C as $t_2$. $t_2$ equals the depth that would have been etched away from a peripheral edge portion as represented by the symbol $t_1$. Because of this extended time period for etching, the thickness of the material remaining in the blank opposed to the concave portion 1a is very thin as shown in the drawing 1C by the symbol $t_3$.

With reference to FIGS. 2 and 5, the quartz crystal vibrator leaf 3 is comprised of tuning fork vibrator portions 3a and a frame portion 3b joined to the tuning fork portion 3a and entirely surrounding the tuning fork. The upper and lower housing elements formed by chemically etching the transparent material, for example, quartz crystal or glass, have concave portions 4a and 5a produced by chemically etching only one side of a central area of the housing element blanks 4 and 5. The peripheral edge portions 4b and 5b have been produced by cutting away material from both side surfaces of the blanks by a chemical etching process. The generally planar housing elements surfaces 4c and 5c at the base of the concave portions 4a and 5a have also been produced by chemically etching of the material. A laser beam 6 is irradiating the quartz crystal vibrator from the outside through a transparent housing element in order to adjust the oscillation frequency of the quartz crystal vibrator. A focusing lens 6a is used in conjunction with the laser beam 6. This quartz crystal oscillator package is produced by sandwiching the vibrator leaf between two housing elements 4, 5 and sealing them as discussed more fully hereinafter. The package has a total thickness indicated as $t_0$. As described above, this quartz crystal oscillator package is produced by etching both sides of the housing element simultaneously and for the same period of time.

There are several deficiencies in the prior art crystal oscillator packages which result from the simultaneous chemical etching of both the peripheral edge portions 4b and 5b and the concave portions 4a and 5a and are described hereinafter. It is necessary that a quartz crystal oscillator used as a time standard in an electronic wristwatch possess a good mechanical strength so as to prevent its breakage or destruction as a result of mechanical external forces such as shocks, vibrations, accelerations and the like. The strength of the housing elements is important because small pieces of broken quartz crystal can enter into the small clearance spaces between the accurate precision gearing used in electronic wristwatches and thereby put the wristwatch out of order, causing poor timekeeping or actually stopping its operation.

In the prior art housing elements with a sectional shape as shown in FIG. 1B, the lateral edge projection 1d is a weak portion, and such a housing element is not suitable for use in a quartz crystal oscillator for an electronic wristwatch.

On the other hand, in the prior art housing elements having a sectional shape as shown in FIG. 1C, because the lateral edge projection $1d$ is very small, this projection $1d$ is not a deterrent to its practical use in an electronic watch. However, the remaining thickness $t_3$ of material opposed to the concave portion $1a$ is so thin, more precisely, $t_3 < t/2$, that the remaining material does not possess sufficient mechanical strength. Control of the remaining wall thickness $t_3$ so as to provide sufficient strength requires that the thickness $t$ in the housing element blank increase, namely, $t > 2t_3$. Consequently the total thickness $t_0$ of the quartz crystal oscillator package is greatly increased if the weakness at wall section $t_3$ is adjusted by starting with a heavier blank. Therefore, a housing element of this type which has been produced by an extended period of etching is also unsuitable in a housing for an ultra-thin quartz crystal oscillator.

Another difficulty in the prior art production of housing elements occurs when the chemical etching is carried out for a long time period. Then, the housing element base surfaces $4c$ and $5c$ in the concave portions $4a$ and $5a$ made by using chemical etching to remove material, are apt to be not truly flat. This lack of flatness can occur for any of a number of reasons, for example, because of the deposition of material due to the chemical reaction of the etching liquid and the housing element material which may be for example, quartz crystal, glass and the like. Also uneven etching may result merely because of the composition of the material used for fabrication of the housing elements, or there may be an orientational dependence in the chemical etching speed which causes a roughness in the surface. Frequancy adjustment of the crystal vibrator can be carried out by irradiating the surface of the leaf $3a$ with a laser beam 6 from outside of the quartz crystal oscillator package after the package has been entirely sealed. However, because the irradiating laser beam is refracted and irregularly reflects at the base surfaces $4c$ and $5c$ of the housing elements, the quantity of metal film deposited on the quartz crystal vibrator leaf $3a$ which is eliminated by action of the laser beam 6 is not exact and an accurate frequency adjustment cannot be accomplished. This defect reduces the yield of acceptable oscillator packages which can be produced and causes the cost to increase.

The quartz crystal oscillator of this invention eliminates all of the above-mentioned faults. FIG. 3 shows a housing element 7 made according to the method of this invention, and FIG. 4 shows an ultra-thin quartz crystal oscillator package constructed by using housing elements 11, 12 fabricated by the method shown in FIG. 3.

The steps in the manufacturing process of the housing elements according to this invention are described in order in accordance with FIGS. 3A, 3B, 3C and 3D.

Figure 3A:
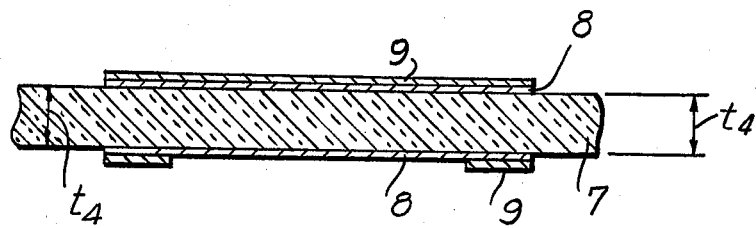
FIGS. 3A, 3B, 3C and 3D are side sectional views illustrating the process of manufacturing housing elements for the quartz crystal oscillator package of this invention.
Figure 3B:
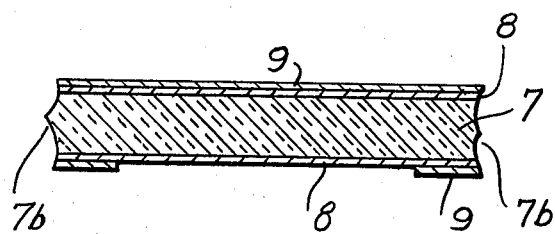

In FIG. 3A, the housing element material 7 is a transparent material such as quartz crystal, glass, and the like having a thickness $t_4$. A metal film 8 is provided on the upper and lower surfaces of the transparent material 7 and further a protecting film 9 such as photo-resist is provided on top of the metal film 8. The peripheral edge portions $7b$ of the housing element 7 is produced as shown in FIG. 3B by chemically etching the transparent material. Sufficient time is allowed for this etching process so that no extended protrusions, as illustrated in FIG. 1B, are produced by the process of this invention.

It should be noted that the presence of the metal film 8 over the entire flat surfaces of the housing element material 7 prevents etching at this time of a concave portion.

Figure 3C:
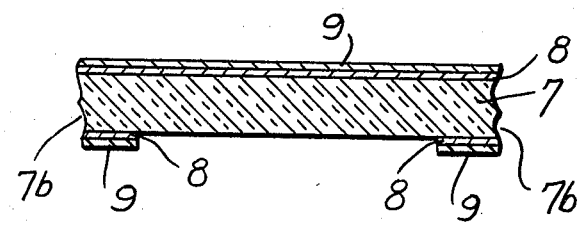
Figure 3D:
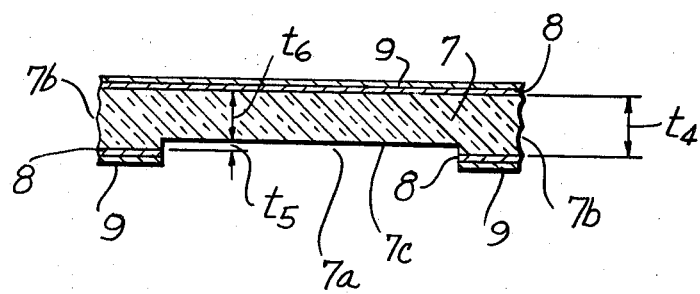

Next by chemically etching the metal film 8, the surface of the transparent material 7 at the location intended to be a concave portion in the finished product is exposed as shown in FIG. 3C. Then the transparent material 7 in the condition shown in FIG. 3C is again etched to produce the conditions shown in FIG. 3D with a concave portion $7a$ etched to a depth $t_5$. The amount of etching used to produce the concave portion $7a$ is the minimum which may be used to house the crystal leaf in a vacuum. Because of the minimal amount of etching, the base surface $7c$ of the concave portion $7a$ is essentially flat. Also, the remaining wall thickness of the material 7 opposed to the concave portion $7a$ has a maximum thickness $t_6$. Thus the case produced by etching in entirely separate steps has minimal peripheral edge projections and has the maximum thickness $t_6$ opposed to the cavity $7a$.

From the novel process of chemically etching the peripheral portion $7b$ and the concave portion $7a$ of the housing element separately, a housing element that overcomes each of the disadvantages of prior art housings noted above, is produced.

In FIG. 4, a quartz crystal vibrator leaf 10, similar to the vibrator leaf illustrated in FIG. 5, consists of a tuning fork portion $10a$ and a peripheral frame portion $10b$ attached to the base portion of the tuning fork portion $10a$ and entirely surrounding the tuning fork portion $10a$. The upper and lower housing elements 12, 11 are formed by chemically etching the transparent material, for example quartz crystal, glass, and the like, according to the method of this invention. The concave portions $11a$, $12a$ are formed by chemically etching only one side in a central region of the housing elements 11, 12. The peripheral edge portions $11b$, $12b$ of the housing elements 11, 12 are cut out by chemically etching the transparent material from both sides. The flat base surfaces $11c$, $12c$ in the concave portions $11a$, $12a$ are also provided by chemical etching from one side. A laser beam 13, irradiated from the outside of the quartz crystal oscillator package through the transparent housing element, is used to adjust the frequency of the oscillating leaf $10a$ therein. A focusing lens $13a$ is used in conjunction with the laser beam 13. The total thickness $t_7$ of the quartz crystal oscillator in FIG. 4 is minimal because of the shallowness of the concave portions $11a$, $12a$ which also provide considerable strength in the wall opposing the concave portions.

In summary, the following merits are provided by the practice of the method of this invention. With multiple individual steps of chemical etching, it is possible to chemically etch for a sufficiently long period of time so as to avoid extended peripheral edge projections. It is also possible to have the concave portion $7a$ (FIG. 3D) etched to a minimum depth. Consequently, when the quartz crystal oscillator package receives a mechanically applied external force, there is no breakage or destruction of the package or the vibrator elements within. Further, the thickness $t_6$ of the wall opposing the concave portion $7a$ is large without increasing the overall thickness of the housing element $t_4$. Accordingly, it is possible to obtain an ultra-thin quartz crystal oscillator package with a sturdy structure and a high resistance to externally-applied forces.

Since the concave portions 11a, 12a can be produced in an extremely short chemical etching time, the base surfaces 11c, 12c in the concave portions 11a, 12a are almost completely flat. Therefore, when a frequency adjustment is carried out by irradiating the quartz crystal vibrator using a laser beam directed from the outside of the package, there is little refraction and irregular reflections of the laser beam at the housing element surfaces 11c, 12c. Such frequency adjustments are accomplished after the quartz crystal oscillator package has been sealed. Because the surfaces 11c, 12c are flat, the quantity of metal film deposited on the quartz crystal vibrator leaf which is eliminated by the laser beam is exact and an accurate frequency adjustment can be accomplished. Accordingly, there are good production yields and a cost reduction is effected.

Such a quartz crystal oscillator package is extremely thin, and the trimming of the oscillation frequency is easily effected by the laser beam as described above after a hermetic seal of the package is provided. However, it is difficult to produce the hermetic seal.

Figure 6:
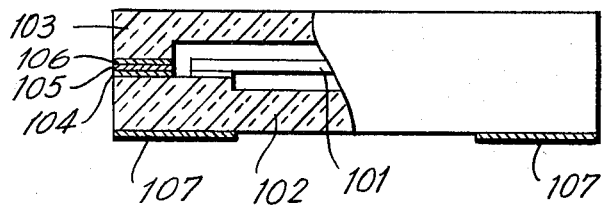
FIGS. 6 and 7 illustrate conventional hermetic seals used in the prior art for producing an ultra-thin quartz crystal oscillator package.
Figure 7:
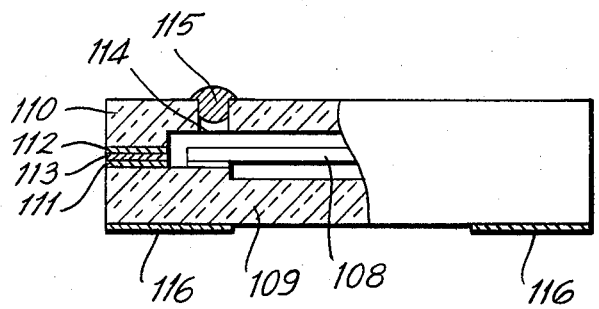

FIGS. 6 and 7 show hermetic seals on conventional ultra-thin quartz crystal oscillator packages of the prior art. In FIG. 6, a quartz crystal vibrator leaf 101 is mounted on a housing element 102 made of a ceramic material. Metal films 104, 106, are provided along the seal surfaces of the housing element 102 and the upper housing element 103. The upper housing element 103 is made of a transparent material such as quartz crystal, glass, and the like. A low melting binder 105 such as solder is provided on the sealing surface of the metal film 106 by solder dipping or a similar process. The low melting binder material 105 is then fused by heating in a vacuum, and a hermetic seal is provided, joining with the metal film 104. External electrode terminals 107 are provided on the housing element 102.

Such a hermetic seal as illustrated in FIG. 6 has the following deficiencies. Because the hermetic seal is provided by using a low melting temperature binder such as solder, gas included in the low melting binder is released during fusion of the solder by heating. The fusion process is carried out with all of the elements under vacuum. As a result, the outgassing from the solder enters into the volume wherein the vibrator leaf is enclosed. The internal volume of an ultra-thin quartz crystal oscillator is extremely small and a good vacuum cannot be maintained within the package when even a small amount of gas from the fusing solder enters the enclosed volume. One way to eliminate this fault would be to degas the solder prior to the application of heat. Such degassing could be accomplished under vacuum. However, because the temperatures are low in the sealing process, i.e., in the order of 150° C., only a small portion of the gas absorbed on the solder surface is removed by such a heat treatment in vacuum. This degassing process is not a sufficient counter-measure against inleakage of gas to the oscillator package. Accordingly, since there is only a partial vacuum inside the ultra-thin quartz crystal oscillator package, the quality factor Q of the oscillator process is not a sufficient counter-measure against inleakage of gas to the oscillator package. Accordingly, since there is only a partial vacuum inside the ultra-thin quartz crystal oscillator package, the quality factor Q of the oscillator is reduced. As a result, a quartz crystal oscillator having a stable output oscillation frequency cannot be produced.

FIG. 7 shows another conventional ultra-thin quartz crystal oscillator of the prior art. A quartz crystal vibrator leaf 108 is mounted on a housing element 109 made of a ceramic material. Metal films 111, 112, coat the seal surfaces of the housing element 109 and the surfaces of the upper housing element 110. The upper housing element 110 is made of a transparent material such as quartz crystal, glass, and the like. The metal films 111, 112, are joined permanently with solder 113. The peripheral hermetic seal described above is produced while there exists an opening 114 in the upper housing element 110. After the peripheral seal has been completed, a final hermetic seal is provided for the crystal oscillator package by pressing, under vacuum, a soft metal 115 into the hole 114 located on the upper housing element 110. External electrode lead-out terminals 106 are provided on the lower housing element 109.

The difficulty with this technique of providing a hermetic seal for the quartz crystal oscillator package arises in that the pressure required to insert the soft metal 115 into the hole 114 tends to break the housing elements. Although this breakage can be avoided by using a thick case, such a hermetic seal is not suitable if there is to be an ultra-thin quartz crystal oscillator. Further, the work is inefficiently accomplished because it is extremely difficult to accurately place a chip of soft metal 115, such as indium, in the hole 114 because the parts are extremely small. Also, when the soft metal chip 115 is not uniform in size or contour, a complete hermetic seal is difficult to accomplish. For all these reasons there is a reduced yield rate and inevitably an increase in cost when the quartz crystal oscillator packages are produced by the method illustrated in FIG. 7.

Figure 8:
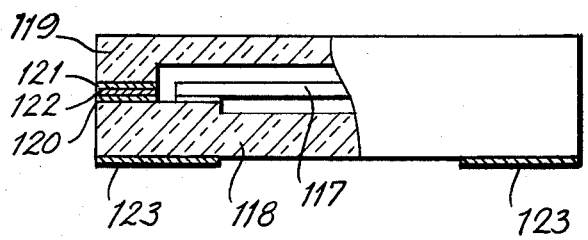
FIG. 8 is side view, partially sectioned, of an ultra-thin quartz oscillator package sealed in accordance with this invention.

FIG. 8 shows an ultra-thin quartz crystal oscillator produced in accordance with this invention. In FIG. 8, a quartz crystal vibrator leaf 117 is mounted on a housing element 118. Metal films 120, 121 coat the seal portions of the lower housing element 118 and the upper housing element 119. An eutectic forming material 122, such as elements tin, indium, polycrystalline silicon, and the like is produced on the upper metal film 121 by vacuum deposition or a like process. The hermetic seal around the periphery of the quartz crystal oscillator package is provided by positioning the upper housing element 119, having the eutectic forming material 122 thereon, on top of the lower housing element 118, having the quartz crystal vibrator leaf 117 positioned thereon. Then the eutectic forming material is fused by heating in a vacuum, and an alloy is formed between the eutectic forming material and the film of metal 120, 121 coating the seal portions of the upper and lower housing elements. Gold or silver is used as the films 120, 121. External electrode terminals 123 are provided on the lower housing element 118.

At least one of the housing elements 118, 119 is fabricated of quartz crystal or a transparent material, such as glass, having a coefficient of thermal expansion close to that of the quartz crystal leaf 117. As a result, after providing the hermetic seal, trimming of the oscillation frequency of the oscillating leaf 117 can be accomplished by applying a laser beam from the outside as described above. This similar coefficient of thermal expansion in the materials prevents the inducement of thermal stress or strain during the heating of the package elements in order to accomplish the hermetic seal. Thus, air-tightness is sufficiently maintained.

There are many advantages in producing quartz crystal oscillator packages as described in this invention. Namely, the eutectic forming material 122 is produced in a vacuum of about $10^{-2}$ torr and releases little if any gas during the fusion by heating. Further, any gas such as oxygen absorbed on the surface of the eutectic forming material 122 can be removed before its use for sealing in a de-oxidizing atmosphere. Accordingly, a high vacuum, hermetic seal is possible to achieve and an ultra-thin quartz crystal oscillator of high stability is produced.

A further advantage inherent in producing crystal oscillator packages by the method of this invention is that no mechanical external force is applied to the housing elements while the hermetic seal is being formed. Accordingly, the housing elements are not broken. Also, since there is no necessity for placing any sealing material such as a soft metal on a seal portion in advance, the working efficiency is good and the yield rate of production is increased. Accordingly, the ultra-thin quartz crystal oscillator produced by these techniques is brought to market at a low price.

Figure 9:
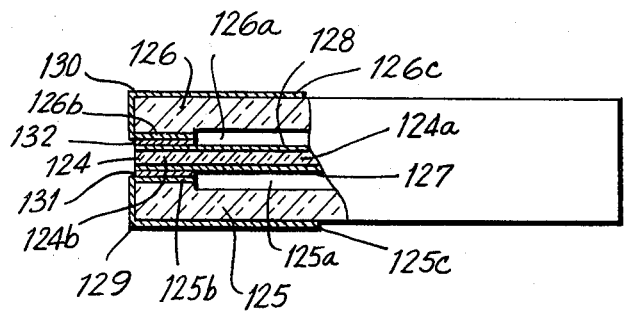
FIG. 9 is an alternative embodiment of an ultra-thin quartz crystal oscillator as shown in FIG. 8.

FIG. 9 shows an alternative embodiment of this invention. In FIG. 9, a quartz crystal vibrator leaf 124 comprises a tuning fork 124a having a frame portion 124b surrounding the tuning fork portion 124a and attached at the base thereof. Electrodes 127,128 are attached to the quartz crystal vibrator leaf 124. The quartz crystal vibrator leaf 124 is sandwiched between lower and upper housing elements 125, 126, respectively, having concave portions 125a, 126a in the centers thereof. Metal films 129, 130, such as gold or silver, are formed extending over the seal portions 125b, 126b of the housing elements 125,126. Extensions of the metal films 129, 130 provide external electrode terminals 125c, 126c. Eutectic forming material 131, 132 made of such materials as the elements tin, indium or polycrystalline silicon, and the like are formed on either the frame portion 124b of the quartz crystal vibrator leaf 124 or on the metal films 129, 130 on the seal portions 125b, 126b of the upper and lower housing elements 125, 126. The hermetic seal is provided by sandwiching the quartz crystal vibrator leaf 124 between the upper and lower housing elements 125 and 126, and then fusing the eutectic forming material 131, 132 by heating all components in a vacuum. The fused eutectic forming materials 131, 132 form eutectic alloys with the metal films 129, 130.

It will thus be seen that the objects set forth above, among those made apparent from the preceding description, are efficiently attained and, since certain changes may be made in carrying out the above method and in the article set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A method for manufacturing a quartz crystal oscillator package having a high internal vacuum, said package comprising a quartz crystal vibrator with a frame, a pair of housing elements having peripheral surfaces, said peripheral surfaces being shaped to register one to the other, a hermetic seal at the periphery of said oscillator package, comprising the steps of:
    (a) coating said peripheral surfaces with a metal film;
    (b) coating at least one of said metal films with a gas free material capable of forming an alloy with said metal film, said alloy forming coating being produced on said at least one said metal film at an ambient pressure less than $10^{-2}$ torr, whereby gas is eliminated from said alloy forming coating during step (b);
    (c) positioning said coated housing elements in an opposed position, said coatings being opposed one to the other, said crystal vibrator with a frame being enclosed within said opposed housing elements;
    (d) drawing a high vacuum over the elements of said quartz crystal oscillator package and within said housing elements;
    (e) applying heat under said high vacuum to fuse said alloy forming coating with said metal film to form an alloy whereby said housing elements are rigidly and hermetically joined together and said package has said high internal vacuum within said joined housing elements.

2. The method of claim 1, wherein said alloy is a eutectic alloy.

3. The method of claim 1, wherein said frame is coated with a metal film, said frame being sandwiched between said peripheral surfaces of said opposed housing elements, and said alloy forming coating element is interposed between said frame and said associated opposed housing elements.

* * * * *